(12) United States Patent
Libera et al.

(10) Patent No.: US 6,240,011 B1
(45) Date of Patent: May 29, 2001

(54) EEPROM CELL WITH IMPROVED CURRENT PERFORMANCE

(75) Inventors: Giovanna Dalla Libera, Monza; Matteo Patelmo, Trezzo Sull 'Adda, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/620,827

(22) Filed: Jul. 21, 2000

(30) Foreign Application Priority Data

Jul. 22, 1999 (IT) .............................. MI99A1617

(51) Int. Cl.⁷ .................................................. G11C 16/04
(52) U.S. Cl. ................... 365/185.01; 257/401; 257/315; 257/316
(58) Field of Search .......................... 365/185.01, 185.05; 257/401, 314, 315, 316, 320

(56) References Cited

U.S. PATENT DOCUMENTS

| | | | |
|---|---|---|---|
| 5,410,171 | * | 4/1995 | Tsuzuki et al. ........................ 257/337 |
| 5,424,569 | * | 6/1995 | Prall ...................................... 257/324 |
| 5,973,360 | * | 10/1999 | Tihanyi ................................. 257/330 |

* cited by examiner

Primary Examiner—Vu A. Le
(74) Attorney, Agent, or Firm—Theodore E. Galanthay; E. Russell Tarleton; Seed IP Law Group PLLC

(57) ABSTRACT

An EEPROM cell with improved current performance, the EEPROM cell having: a selection transistor with a drain region, a source region and a control gate, a memory cell having a drain region, a source region, a control gate and a floating gate, the drain region of the memory cell and said source region of the selection transistor are connected together, and the source and drain regions of the memory cell and the source and drain regions of the selection transistor share an active area with a pair of sides that linearly converge from one end to the other end

11 Claims, 2 Drawing Sheets

EEPROM CELL WITH IMPROVED CURRENT PERFORMANCE

TECHNICAL FIELD

The present invention relates to an EEPROM cell with improved current performance and to the relative building process.

BACKGROUND OF THE INVENTION

The demand for larger EEPROM memories imposes greater efforts in smaller dimensions for memory cells. If the area of an elementary cell is decreased, and in particular if the dimension of the active area is decreased, there are risks of decreasing the value of the current that flows in the cell during the reading phase. In EEPROM cells the value of the driving current is determined in part by the selection transistor of the bit line that is set in series to the cell itself.

The selection transistor has different design characteristics that are partially contrasting. Particularly, it must have a threshold voltage sufficiently high in order to stop the current when its corresponding cell is not selected, and it must bear a higher current than that of the single cell when it is in a reading phase. In order to be able to bear the driving current of the cell, the active area of the selection transistor has greater dimensions than the dimensions of the active area of the memory cell.

The source of the selection transistor is directly connected to the drain of the floating gate memory cell, preferably it is only one active area. This active area, in the zone of passage from the source area and the drain area, presents two pair of edges, that as a whole, as seen in a top plan view, have a shape substantially similar to that of a funnel just in the zone where the capacitor implants are formed and where the tunnel oxide is grown. This is a very critical zone and during the growth of the oxide crystallographic defects could occur that can create structural stress.

SUMMARY OF THE INVENTION

The disclosed embodiment of the present invention is directed to an EEPROM cell, comprising a memory cell and a selection transistor, and having smaller dimensions according to the manufacturing process while avoiding limitations of the maximum bearable current and overcoming problems of the known art relatively to the defects associated with the edges. According to the embodiments of the present invention, the foregoing is attained by means of an EEPROM cell comprising a selection transistor having a drain region, a source region and a control gate, a memory cell having a drain region, a source region, a control gate and a floating gate, said drain region of said memory cell and said source region of said selection transistor are connected together, and the source and drain regions of said memory cell and the source and drain regions of said selection transistor have an area of value respectively increasing.

The foregoing is attained by means of a process for the building of an EEPROM cell comprising forming a floating gate memory cell having an active area, forming a selection transistor of said memory cell on a substrate having an active area, and by forming said active areas of said memory cell and of said selection transistor respectively of linearly increasing dimension.

BRIEF DESCRIPTION OF THE DRAWINGS

The features and advantages of the present invention will be made more evident by the following detailed description of a particular embodiment thereof, illustrated as a non-limiting example in the annexed drawings, wherein.

DETAILED DESCRIPTION OF THE INVENTION

Figure 1:
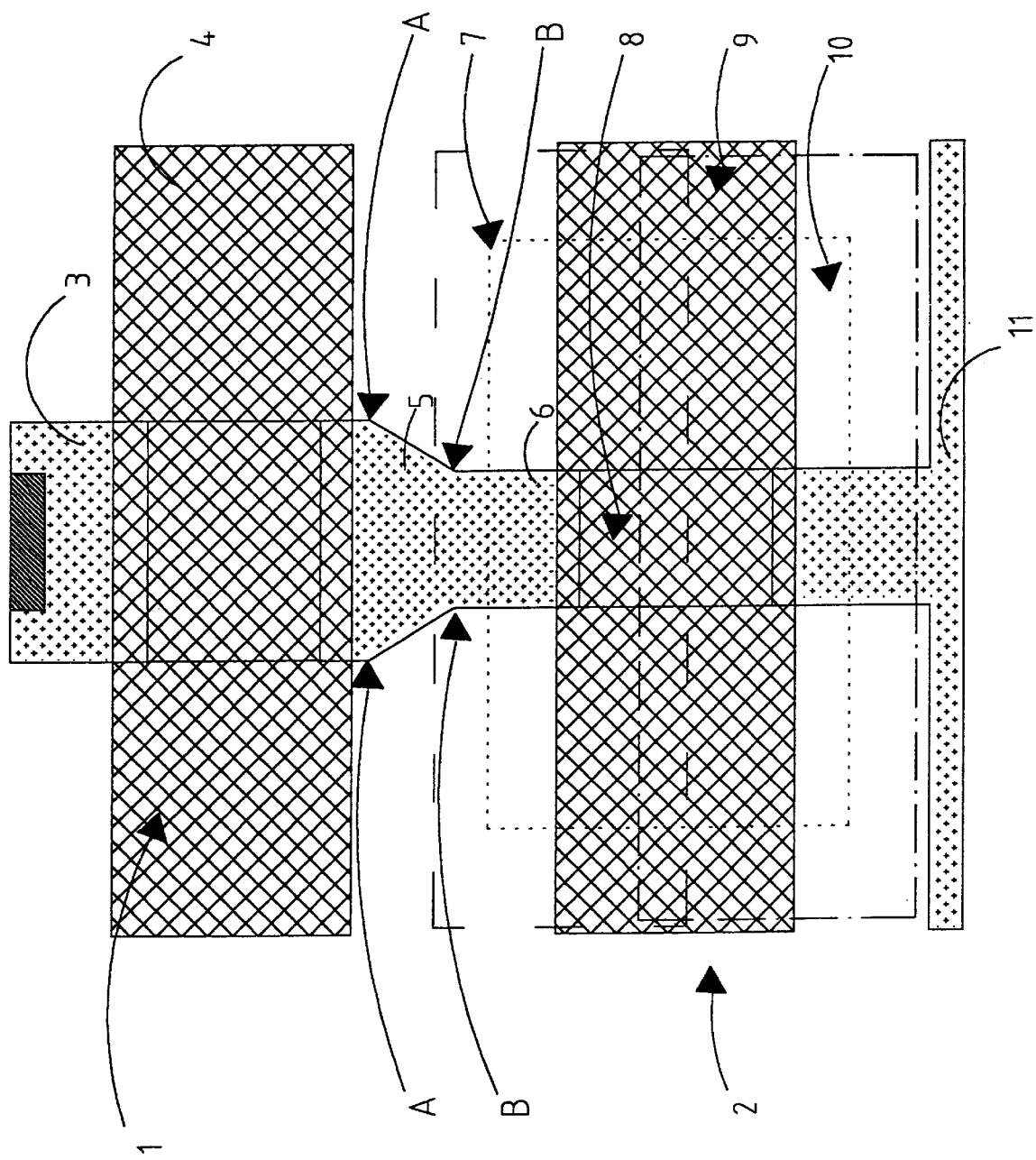
FIG. 1 is a top plan view of a memory cell according to the known art.

In FIG. 1 is shown a selection transistor 1 and a floating gate memory cell 2, according to the known art.

The selection transistor 1 has a drain active region 3, a source active region 5 and a control gate 4.

Memory cell 2 has a drain active region 6, a source active region 11, a floating gate 10 (poly1), a control gate 9 (poly2), a layer of tunnel oxide 8 (of thickness about 80 A) through which passes, for Fowler-Nordheim effect, the electric charge during programming, and a layer of implanted capacitors 7 (generally phosphorus is used) for maintaining the electric continuity between the selection transistor (of the bit line) and the tunnel area, creating an n-type junction that connects the source 5 of the selection transistor 1 and the tunnel area 8 of the cell 2.

In FIG. 1 the source 11 has the form of a T since it serves to connect the cells of a byte together, but the form can be different and the connection can be effected by means of metal.

In order to be able to bear the driving current of the cell, the active area of the selection transistor 1 has greater dimensions in the active area of memory cell 2 than in the active area of the selection transistor 1.

Particularly it can be noted that the drain area 6 of memory cell 2 and the source area 5 of the selection transistor 1 constitutes a single active area having, in plan form, a shape substantially similar to that of a funnel.

The width of the source area 5 is greater than the width of the drain area 6. This active area presents a first pair of edges A having a distance equal to the width of the drain area 6. Thereafter it presents a second pair of edges B having a distance between them equal to the width of the source area 5.

The edges A and B are in the zone where the capacitor implants 7 occur and where the tunnel oxide 8 is grown. This is a very critical zone and the growth of the oxide creates stresses and strains in the structure.

Figure 2:
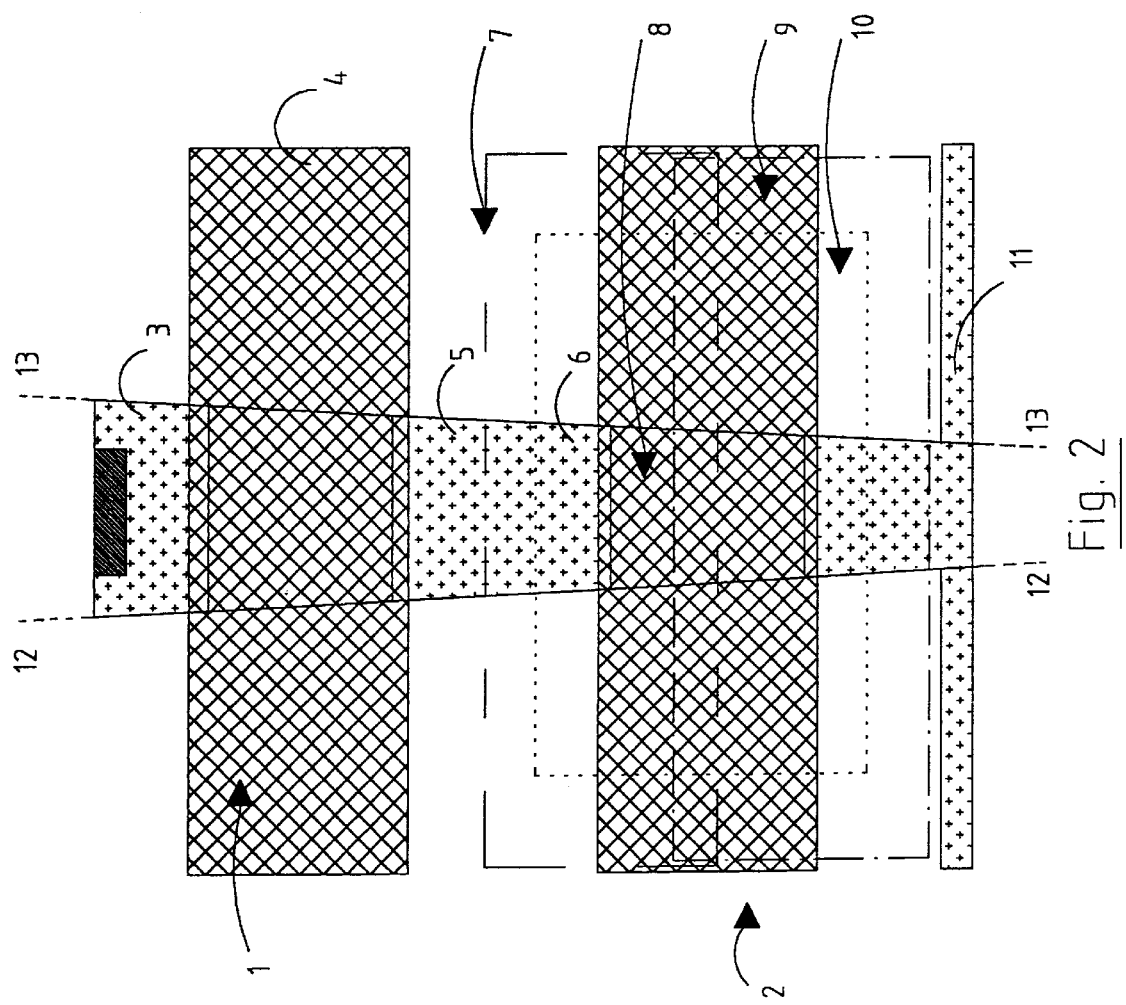
FIG. 2 is a top plan view of a memory cell according to the present invention.

In FIG. 2 is shown a selection transistor 1 and a floating gate memory cell 2 according to one embodiment of the present invention. For clarity and ease of reference, components in FIG. 2 that are identical to the components in FIG. 1 will have the same reference numbers.

The source 11 and drain 6 regions of memory cell 2 and the source 5 and drain 3 regions of the selection transistor 1 have an active area of value respectively increasing, preferably in a linear way.

The respective sides that delimit the boundaries of such regions, placed along a prefixed direction that connects the memory cell 2 and the selection transistor 1, lie, substantially, on a pair of virtually straight lines 12 and 13. Such straight lines 12 and 13 converge in an external point to the source 11 zone of the memory cell 2.

The typical dimensions involved in one embodiment are the following: the width of the source area 11 of the memory cell 2 is about 0.4 $\mu$m; the width of the drain area 3 of the selection transistor 1 is about 0.8 $\mu$m; and the bearable current of the EEPROM cell is about 50 $\mu$A.

With this solution the following results are obtained:
1) the active area of the selection transistor 1 is wider than that of the memory cell 2, and therefore could bear a greater current than that of the single cell;
2) the pair of edges A and B in the prior art cell are eliminated;
3) it has a high driven current without a lower threshold value of the selection transistor 1; and
4) the new design minimizes or eliminates the funnel effect of the active area of memory cell 2 in the source zone 11.

If the threshold voltage is lowered, the transistor is able to bear a greater current. But if the threshold voltage is lowered the lossing current increases.

The funnel effect consists in a widening of the active area in the source zone 11. In the embodiment formed in accordance to the present invention, that linearly reducing width of the active area proceeding toward the source, the funnel effect phenomenon is reduced.

The present invention finds application in a not-aligned cell, but it could be also used in double poly self-aligned cells.

While a preferred embodiment of the invention has been illustrated and described, it is to be understood that various changes can be made therein without departing from the spirit and scope of the invention. Thus, the invention is to be limited only by the scope of the following claims and the equivalents thereof.

What is claimed is:

1. An EEPROM cell, comprising:
   a selection transistor having a drain region, a source region and a control gate,
   a memory cell having a drain region, a source region, a control gate and a floating gate,
   said drain region of said memory cell and said source region of said selection transistor are connected together, and said source and drain regions of said memory cell and said source and drain regions of said selection transistor have an area of value linearly increasing.

2. The EEPROM cell of claim 1 wherein said area of value is increasing in a linear way from the drain region of the selection transistor to the source region of the memory cell.

3. The EEPROM cell of claim 1 wherein each of said source and drain regions of said selection transistor and said source and drain regions of said memory cell are confined within a polygon having a plurality of sides, said sides of said polygons, with respect to a predetermined direction lie on a pair of substantially straight lines.

4. The EEPROM cell of claim 1 wherein said drain region of said memory cell and said source region of said selection transistor are constituted by a single region.

5. The EEPROM cell of claim 1 wherein said memory cell comprises a capacitor implant and a layer of tunnel oxide, said capacitor implant connects said selection transistor electrically to said tunnel oxide.

6. The EEPROM cell of claim 3 wherein the sides with respect to a predetermined direction of said source and drain regions of said selection transistor and said source and drain regions of said memory cell have not aligned edges.

7. An EEPROM cell, comprising:
   an active area forming source and drain regions of a selection transistor and a memory cell, the active area comprising an elongate shape having a first end and a second end defined by a pair of transverse sides and a pair of longitudinal sides, the longitudinal sides formed substantially straight their entire length and converging towards each other from the first end to the second end of the active area.

8. The EEPROM cell of claim 7, wherein the first end of the active area comprises a drain region of the selection transistor, the second end of the active area comprises a source region of the memory cell, and the source region of the selection transistor and the drain region of the memory cell are connected together in a central portion of the active area.

9. The EEPROM cell of claim 8, wherein the memory cell further includes a capacitive implant and a tunnel oxide.

10. The EEPROM cell of claim 8, further comprising first and second active area extensions that extend laterally from the second end of the active area.

11. The EEPROM cell of claim 10, wherein the memory cell further includes a capacitive implant and a tunnel oxide.

* * * * *